United States Patent
Mann et al.

(10) Patent No.: US 10,934,631 B1
(45) Date of Patent: Mar. 2, 2021

(54) HYDROTHERMAL GENERATION OF SINGLE CRYSTALLINE MOLYBDENUM DISULFIDE

(71) Applicant: Government of the United States, as represented by the Secretary of the Air Force, Wright-Patterson AFB, OH (US)

(72) Inventors: James M. Mann, Springboro, OH (US); Thomas A. Bowen, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 295 days.

(21) Appl. No.: 16/238,599

(22) Filed: Jan. 3, 2019

Related U.S. Application Data

(60) Provisional application No. 62/638,339, filed on Mar. 5, 2018.

(51) Int. Cl.
*C30B 7/10* (2006.01)
*C30B 33/02* (2006.01)
*C30B 29/46* (2006.01)
*C23C 16/30* (2006.01)

(52) U.S. Cl.
CPC .......... *C30B 7/10* (2013.01); *C23C 16/305* (2013.01); *C30B 29/46* (2013.01); *C30B 33/02* (2013.01)

(58) Field of Classification Search
CPC .......... C30B 7/10; C30B 29/46; C23C 16/305
See application file for complete search history.

(56) References Cited

FOREIGN PATENT DOCUMENTS

CN 106929921 A * 7/2017 ............. C30B 29/46

OTHER PUBLICATIONS

European Patent Office, English computer translation of CN 106929921 A (Year: 2020).*
Veeramalai, P., Enhanced field emission properties of molybdenum disulphide few layer nanosheets synthesized by hydrothermal method, Applied Surface Science 389 (2016) 1017-1022.
Reale, F., From bulk crystals to atomically thin layers of group VI-transition metal dichalcogenides vapour phase synthesis, Applied Materials Today 3 Nov. 22, 2016.
Peng, Y., Hydrothermal Synthesis of MoS2 and Its Pressure-Related Crystallization, Journal of Solid State Chemistry 159, 170}173 (2001).
Lin, H., Hydrothermal synthesis and characterization of MoS2 nanorods, Materials Letters 64 (2010) 1748-1750.

* cited by examiner

*Primary Examiner* — Matthew J Song
(74) *Attorney, Agent, or Firm* — AFMCLO/JAZ; Timothy Barlow

(57) ABSTRACT

Disclosed is a method for synthesizing single crystalline molybdenum disulfide via a hydrothermal process that minimizes or eliminates carbon byproducts. The method involves providing two components, including a source of molybdenum and a mineralizer solution, to an inert reaction vessel, heating one zone sufficiently to dissolve the source of molybdenum in the mineralizer solution, and heating a second zone to a lower temperature to allow thermal transport to drive the dissolved material to the second zone, and then precipitate MoS2 on a seed crystal.

7 Claims, 2 Drawing Sheets

HYDROTHERMAL GENERATION OF SINGLE CRYSTALLINE MOLYBDENUM DISULFIDE

CROSS-REFERENCE TO RELATED APPLICATIONS

This application claims priority to U.S. Provisional Application 62/638,339, filed on Mar. 5, 2018, which is incorporated by reference in its entirety.

STATEMENT OF GOVERNMENT INTEREST

The invention described herein may be manufactured, used, and/or licensed by or for the United States Government.

FIELD OF THE INVENTION

The invention is related to a method for creating single crystalline molybdenum disulfide ($MoS_2$), and specifically to a hydrothermal method for generating large (preferably, having one dimension greater than 150 μm) $MoS_2$ crystals.

BACKGROUND

Graphene-like two-dimensional (2D) transition metal dichalcogenides (TMDCs) have been attracting a wide range of research interests. Molybdenum disulfide ($MoS_2$) is one of the most commonly utilized TMDCs, as its band gap of 1.8 eV in monolayer and layer dependence of band structure make it intriguing for multiple applications in scientific and industrial endeavors.

However, hydrothermal techniques used to grow bulk $MoS_2$ typically involve the sulfurization of a Molybdenum compound: reacting Molybdenum and Sulfur containing species, resulting in unwanted carbon byproducts. Examples include: $HSCH_2CHNH_2COOH$ with $MoO_3$; $CSN_2H_4$ with $(NH_4)_6Mo_7O_{24}$; $Na_2MoO_4$ with $CH_3CSNH_2$; and $(NH_4)_6Mo_7O_{24}$ with S. Other hydrothermal growth techniques utilize Teflon-lined Parr bombs with limited operating temperature ranges, which limits the range of crystal structures that can be produced.

As such, a hydrothermal process that minimizes or eliminates unwanted carbon byproducts and allows a large range of crystal structures to be generated, is desirable.

SUMMARY OF THE INVENTION

Disclosed is a method for producing molybdenum disulfide crystalline structures. The method involves providing substantially purified $MoS_2$ and a mineralizer solution to a first portion of an inert reaction vessel in an autoclave, dissolving the substantially purified $MoS_2$ into the mineralizer solution by heating the first zone to a first temperature at a pressure. By heating a second portion of the inert reaction vessel to a second, colder temperature, a thermal gradient can be formed that allows the $MoS_2$ saturated solution to be transported to the second portion, whereupon the $MoS_2$ can be precipitated onto a seed crystal. In certain embodiments, the first temperature and second temperature may advantageously be above the critical temperature of water. In certain embodiments, the difference between the first temperature and second temperature may advantageously be less than or equal to 50° C. In certain embodiments, the first temperature may advantageously be between 200° C. and 800° C. and/or the pressure may be between 200 psi and 40,000 psi. In certain embodiments, the temperature and pressure conditions may advantageously be maintained for at least 20 days. In certain embodiments, heating bands are used to provide heat to the inert reaction vessel. In certain embodiments, the inert reaction vessel may utilize silver, gold, platinum, and/or palladium. In certain embodiments, the mineralizer solution is an alkali fluoride or alkali hydroxide, which may have a concentration between 0.05 M and 30 M.

The method may also involve sorting by size at least some of the precipitated $MoS_2$ using one or more mesh sieves, annealing at least some of the precipitated $MoS_2$, and/or extracting a few atomic layers from the grown bulk $MoS_2$ crystals via mechanical exfoliation.

Also disclosed is a method for producing molybdenum disulfide crystalline structures, which involves providing a first powder comprising molybdenum and a mineralizer solution comprising sulfur to a first zone of an inert reaction vessel in an autoclave, dissolving the first powder into the mineralizer solution by heating the first zone to a first temperature at a pressure, and precipitating $MoS_2$ on a seed crystal in a second zone heated to a second temperature that is less than the first temperature.

In certain embodiments, the mineralizer solution includes CsF and/or $H_2SO_4$. In certain embodiments, the first temperature and second temperature may advantageously be above the critical temperature of water. In certain embodiments, the difference between the first temperature and second temperature may advantageously be less than or equal to 50° C. In certain embodiments, the first temperature may advantageously be between 200° C. and 800° C. and/or the pressure may be between 200 psi and 40,000 psi. In certain embodiments, the temperature and pressure conditions may advantageously be maintained for at least 20 days. In certain embodiments, the inert reaction vessel may utilize silver, gold, platinum, and/or palladium.

BRIEF DESCRIPTION OF THE DRAWINGS

An understanding of the following description will be facilitated by reference to the attached drawings, in which.

DETAILED DESCRIPTION

Figure 1:
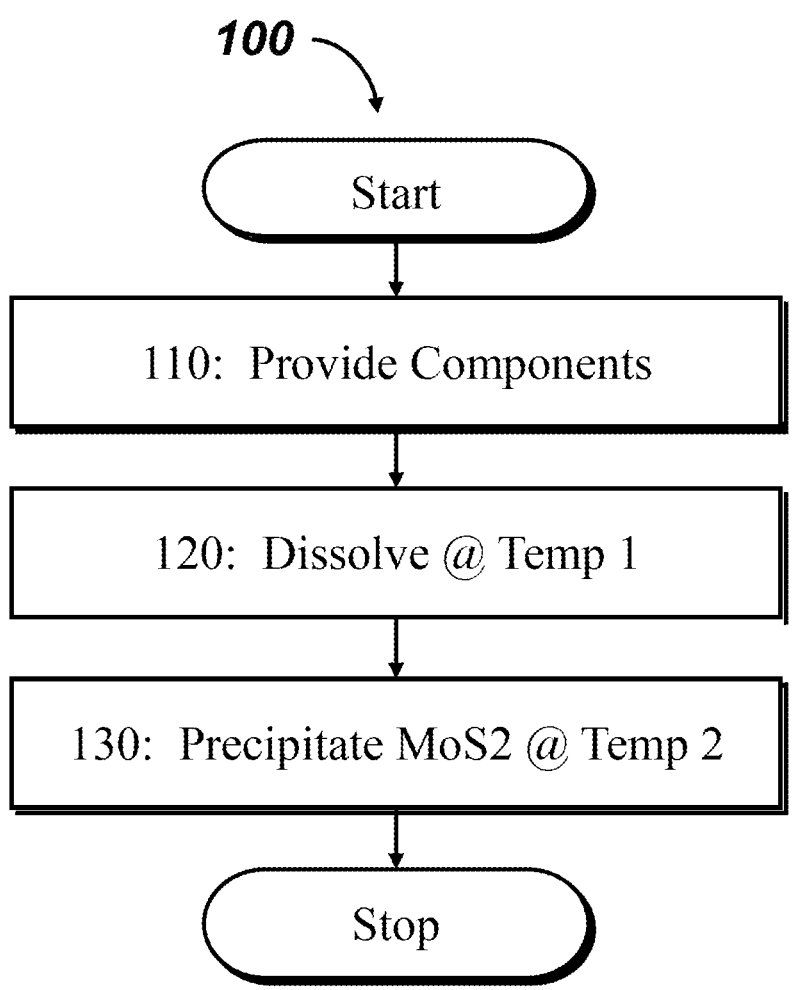
FIG. 1 is a flowchart describing an embodiment of the disclosed methods.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "substantially purified" as used herein refers to a material containing impurities at a concentration of less than or equal to 1% by weight, more preferably less than 0.5% by weight, and still more preferably less than 0.1% by weight.

Figure 2:
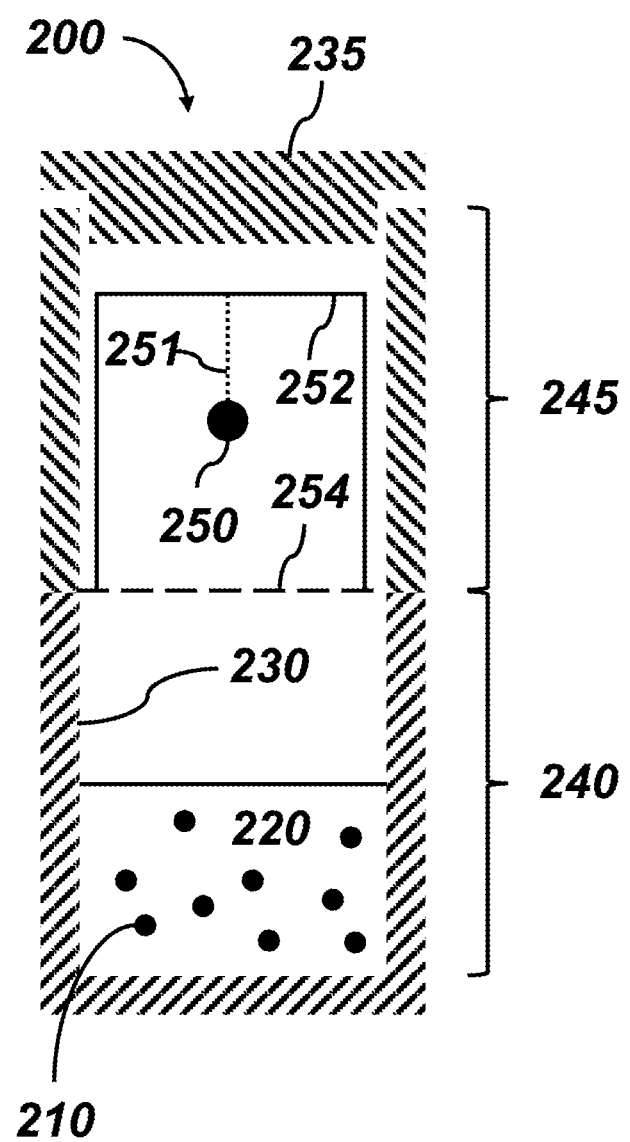
FIG. 2 is a diagrammatic illustration of an inert reaction vessel following an embodiment of the disclosed methods.

An embodiment of the method can be seen in reference to FIGS. 1 and 2. The method (100) for producing molybdenum disulfide crystalline structures typically begins by providing (110) at least two components (210, 220). The two components (210, 220) together should provide both a source of molybdenum and a source of sulfur.

The first component (210) is a powder comprising molybdenum. In preferred embodiments, the first components is substantially purified $MoS_2$. However, other powders comprising molybdenum may be utilized. For example, substantially purified molybdenum can be used. Preferably, sources of molybdenum that do not contain carbon are used.

The second component (220) is a mineralizer solution. The mineralizer preferably includes one or more alkali fluorides or alkali hydroxides. This include, but is not limited to, cesium hydroxide, cesium fluoride, sodium hydroxide, lithium hydroxide, lithium fluoride, rubidium hydroxide, rubidium fluoride, potassium hydroxide, potassium fluoride, sodium fluoride, or sodium chloride, or an ammonium fluoride or hydroxide. Preferably, the fluorides or hydroxides in the mineralizer solution have a concentration of between 0.05 M and 30 M, more preferably between 0.5 M and 20 M, and still more preferably between 0.5 M and 10 M. Two or more of these materials may be used in the mineralizer solution, at equal or different concentrations—for example, the mineralizer solution could contain 2M sodium hydroxide and 4M sodium chloride, 6M sodium hydroxide and 2M sodium chloride, or 2M sodium hydroxide and 2M ammonium hydroxide.

In embodiments where the first component (210) is not a source of sulfur, the mineralizer solution (220) should act as the sulfur source. For example, in some embodiments, sulfuric acid is utilized as the mineralizer solution.

The two components (210, 220) are provided to an inert reaction vessel (200) for use in an autoclave. The inert reaction vessel (200) typically has walls (230) and a cap (235) that define a cavity in which the reaction will take place. Any surface exposed to that interior cavity should be composed of a material that is inert—that is, stable and having little to no reactivity with at least the first and second components under the desired operating conditions. Typically, the inert reaction vessel (200) will be comprised of a precious metal, which includes but is not limited to silver, gold, ruthenium, rhodium, palladium, osmium, iridium, and platinum.

Depending on the first and second component, and the operating temperature and pressure, a material that would be considered "inert" at low temperatures may no longer be "inert" at higher temperatures. For example, at temperatures of, e.g., 250° C. at 20,000 psig with $MoS_2$ powder and a 2M CsF mineralizer solution, silver and platinum are inert, while at 450° C., silver is generally no longer inert while platinum remains inert. In some embodiments, the formerly inert material may be incorporated into the formed crystals at these elevated temperatures.

The inert reaction vessel (200) or ampoule is generally divided into at least two zones (240, 245). A precious metal seed ladder (252)—which may be a similarly inert material as the ampoule—with a $MoS_2$ seed crystal (250) may be positioned in the second zone (245) of the inert reaction vessel. As is known in the art, the seed crystal is typically bored to admit a thin precious-metal wire (251), which is then mounted upon the support ladder (252) which is typically made of the same material.

A porous baffle (254) may be present, which may be the same material as the wire or ampoule. In systems with baffles, the baffles are located approximately midway between the seed crystal and the first component (typically, $MoS_2$ feedstock). However, the baffles may also be positioned in the first zone (240), second zone (245), or some intermediate position between the seed crystal and the first component. In certain embodiments, the porous baffle (254) has a total baffle opening of less than or equal to 25% in cross-sectional area, preferably less than or equal to 20%, and more preferably less than or equal to 15%.

In certain embodiments, after the first component (210) is added, the ladder (252) and seed crystal (250) are added, after which the top is mostly sealed. The mineralizer solution (220) is then added to the inert reaction vessel (230) via, e.g., a syringe, through a gap left for that purpose.

Once the components are in place in the inert reaction vessel, the vessel (200) is sealed (e.g., welding the cap (235)

into place, tightening clamps onto cap, etc.). In certain embodiments, no cap (235) is utilized, so the top of the ampoule may be pinched closed and may then be welded. After placing the vessel into an autoclave, counter-pressure materials (e.g., water, etc.) may be added into the autoclave to prevent the vessel (200) from rupturing.

Typically, the autoclave is then sealed as well. Band heaters may then be attached, and insulation may then be applied.

Referring back to FIGS. 1 and 2, after providing the materials (210, 220) to the reaction vessel (200), the first component (210) is dissolved (120) into the mineralizer solution (220) by heating a first zone (240) of the reaction vessel (200) to a first temperature at a pressure. Preferably, the heat is provided via heat bands placed around a particular zone, but other methods, as understood in the art, are also applicable.

The first temperature has a theoretical upper limit based on the limits of the inert reaction vessel, but typically the temperature will be between 200° C. and 800° C., preferably between 300° C. and 700° C., and more preferably between 400° C. and 600° C. In certain preferred embodiments, the first temperature is above the critical temperature of water.

The pressure is typically between 200 psi and 40,000 psi, and preferably between 10,000 and 40,000 psi.

To prevent the dissolution of the seed crystal, the first zone may be heated up to temperature before the second zone is heated up, to saturate the mineralizer.

The second zone (245) of the reaction vessel (200) is heated to a second temperature that is less than the first temperature. In certain preferred embodiments, the second temperature is above the critical temperature of water. By surpassing the critical point of water, the solubility of $MoS_2$ may be increased to elicit larger spontaneous nucleation and provide improved conditions for bulk crystal growth via transport growth reactions.

The temperature difference between the first and second temperature controls the rate of transport. In various embodiments, the temperature difference between the first temperature and second temperature is less than or equal to 100° C., preferably less than or equal to 50° C., and more preferably less than or equal to 40° C. In certain embodiments, the ratio of the second temperature (in ° C.) to the first temperature (in ° C.) is between 0.9:1 and 0.95:1, and preferably between 0.91:1 and 0.93:1.

Referring back to FIGS. 1 and 2, the components (preferably the dissolved substantially purified $MoS_2$ powder) is transported via thermal transport from the first zone (240) to the second zone (245). The cooler region (245), having a lower solubility limit than that of the hotter region (240), promotes precipitation of $MoS_2$. The precipitates occurring during the precipitation step (130) can nucleate either spontaneously on the walls (230) or via transport growth on a seed crystal (250).

Generally, the operating conditions and the desired size of the $MoS_2$ crystals determines the length of time at which the operating conditions must be maintained. Typically, the temperature and pressure conditions are maintained for at least 20 days. In certain embodiments, this is at least 40 days.

Once the desired time has been reached, the system can be cooled. Upon cooling, the ampule can be removed from the autoclave and opened. After opening, the ladder containing the seed crystal can be removed.

The particulates may have one or more polygonal shapes, including but not limited to triangular and hexagonal. In preferred embodiments, the particulates are hexagonal in shape.

In some embodiments, the transport growth conditions may also anneal the seed crystal to, e.g., improve quality, layer thinning, etc.

In some embodiments, a separate annealing step may be used. As is known in the art, annealing can be done in a variety of ways, including, e.g., thermal annealing (e.g., 650° C. in a 100 torr argon gas with a moderate flow rate, or 450° C. in nitrogen flow, or 200° C. in vacuum).

In some embodiments, crystals may be sorted by size, using one or more mesh sieves.

Typically, smaller particulates will pass through the filter(s) to be collected on, e.g., filter paper, while larger particulates will remain in the sieve(s). For example, using a 50 μm and a 10 μm sieve, crystals could be sorted into those larger than 50 those between 10 and 50 and those less than 10 In certain embodiments, one sieve greater than 200 μm is used in conjunction with another sieve of between 50 μm and 100 μm.

Both the transport growth crystal and the spontaneously nucleated crystals may then be mechanically exfoliated prior to characterization and eventual use in two-dimensional electronics.

Additionally, as is known in the art, crystals recovered after growth can further be exfoliated (e.g., mechanically, chemically, etc.) to extract a few atomic layers from the grown bulk $MoS_2$. For example, applying and removing adhesive tape to a surface of a crystal allows the extraction of one, or more atomic layers from the grown bulk $MoS_2$ crystals by mechanically exfoliating. Typically, only a few layers at most are removed via mechanical exfoliating techniques.

Example 1

A silver tube, having a 0.75-inch internal diameter and an overall length of 10 inches was provided as an inert reaction vessel for use within a 1.25 inch internal diameter autoclave constructed from Inconel 718. Between 10 and 12 grams of powder $MoS_2$ feedstock was added to the bottom section of the tube. A silver ladder with a porous baffle (~15%) and a $MoS_2$ seed crystal was then loaded into silver tube. The seed crystal was located in the upper section of the silver tube and the baffle was located midway between the seed crystal and the $MoS_2$ feedstock. 35 mL of 2M cesium fluoride mineralizer solution was then added to the tube prior to sealing it shut via welding. The fully assembled silver reaction tube was then loaded into the autoclave and counter pressure water was added to the autoclave to prevent the silver tubing from rupturing. Internal band heaters are applied to the external surface of the autoclave. Three band heaters were used. The bottom band heater, which corresponds with the feedstock zone, was held at 415° C. The middle band heater, which corresponds with the seed zone is held at 380° C. The upper band heater extends above the silver tube and is held at 380° C. The application of the temperature generated 20-25 kpsi of pressure. These conditions were maintained for 21 days. After opening, a hexagonal single crystal $MoS_2$ in excess of 150 μm was identified after sieving with 75 μm and 212 μm sieves.

Example 2

A silver tube, having a 0.75-inch internal diameter and an overall length of 10 inches was provided as an inert reaction vessel for use within a 1.25-inch internal diameter autoclave constructed from Inconel 718. 7.46 grams of powder $MoS_2$ feedstock was added to the bottom section of the tube. A silver ladder with a porous baffle (~15%) and a $MoS_2$ seed crystal was then loaded into silver tube. The seed crystal was located in the upper section of the silver tube and the baffle was located midway between the seed crystal and the $MoS_2$ feedstock. 33 mL of 2M cesium fluoride mineralizer solution was then added to the tube prior to sealing it shut via welding. The fully assembled silver reaction tube was then loaded into the autoclave and counter pressure water was added to the autoclave to prevent the silver tubing from rupturing. Internal band heaters are applied to the external surface of the autoclave. Three band heaters were used. The bottom band heater, which corresponds with the feedstock zone, was held at 350° C. The middle band heater, which corresponds with the seed zone is held at 325° C. The upper band heater extends above the silver tube and is held at 325° C. The application of the temperature generated 17-23 kpsi of pressure. These conditions were maintained for 21 days. After opening, a hexagonal single crystal $MoS_2$ in excess of 150 μm was identified after sieving with 75 μm and 212 μm sieves.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein and are intended to be within the spirit and scope of the invention. Accordingly, the foregoing description is by way of example only, and not limiting. The invention is limited only as defined in the following claims and equivalents thereto.

What is claimed is:

1. A method for producing molybdenum disulfide crystalline structures, comprising the steps of:
   providing a first powder comprising molybdenum and a mineralizer solution comprising sulfur to a first zone of an inert reaction vessel in an autoclave;
   dissolving the first powder into the mineralizer solution by heating the first zone to a first temperature at a pressure; and
   precipitating $MoS_2$ on a seed crystal in a second zone heated to a second temperature that is less than the first temperature.

2. The method according to claim 1, wherein the mineralizer solution includes a compound selected from the group consisting of CsF, $H_2SO_4$, and combinations thereof.

3. The method according to claim 1, wherein the inert reaction vessel comprises gold or platinum.

4. The method according to claim 1, wherein the first temperature and second temperature are above the critical temperature of water.

5. The method according to claim 1, wherein the difference between the first temperature and second temperature is less than or equal to 50° C.

6. The method according to claim 1, wherein the pressure is between 200 psi and 40,000 psi.

7. The method according to claim 1, wherein the mineralizer solution has a concentration of between 0.05 M and 30 M.

* * * * *